(12) United States Patent
Colenbrander (10) Patent No.: US 12,007,924 B2
(45) Date of Patent: *Jun. 11, 2024

(54) RACK ASSEMBLY PROVIDING HIGH SPEED STORAGE ACCESS FOR COMPUTE NODES TO A STORAGE SERVER THROUGH A PCI EXPRESS FABRIC

(71) Applicant: Sony Interactive Entertainment Inc., Tokyo (JP)

(72) Inventor: Roelof Roderick Colenbrander, Costa Mesa, CA (US)

(73) Assignee: Sony Interactive Entertainment Inc., Tokyo (JP)

(*) Notice: Subject to any disclaimer, the term of this patent is extended or adjusted under 35 U.S.C. 154(b) by 19 days.

This patent is subject to a terminal disclaimer.

(21) Appl. No.: 17/731,151

(22) Filed: Apr. 27, 2022

(65) Prior Publication Data

US 2022/0253394 A1 Aug. 11, 2022

Related U.S. Application Data

(63) Continuation of application No. 16/945,635, filed on Jul. 31, 2020, now Pat. No. 11,321,259.

(Continued)

(51) Int. Cl.
| | |
|---|---|
| G06F 13/38 | (2006.01) |
| G06F 13/16 | (2006.01) |
| G06F 13/40 | (2006.01) |
| G06F 13/42 | (2006.01) |
| H04L 49/351 | (2022.01) |
| H04L 67/1097 | (2022.01) |

(52) U.S. Cl.
CPC ........ *G06F 13/382* (2013.01); *G06F 13/1668* (2013.01); *G06F 13/4022* (2013.01); *G06F 13/4221* (2013.01); *G06F 13/4282* (2013.01); *H04L 49/351* (2013.01); *H04L 67/1097* (2013.01); *G06F 2213/0026* (2013.01); *G06F 2213/3808* (2013.01)

(58) Field of Classification Search
None
See application file for complete search history.

(56) References Cited

U.S. PATENT DOCUMENTS

| | | | |
|---|---|---|---|
| 6,717,576 B1 * | 4/2004 | Duluk, Jr. ............... | G06T 11/40 345/506 |
| 7,031,838 B1 * | 4/2006 | Young .................... | G06Q 50/00 702/5 |

(Continued)

*Primary Examiner* — Henry Tsai
*Assistant Examiner* — Christopher A Bartels
(74) *Attorney, Agent, or Firm* — PENILLA IP, APC (57) ABSTRACT

A network architecture including network storage. The network architecture includes a plurality of streaming arrays, each streaming array including a plurality of compute sleds, wherein each compute sled includes one or more compute nodes. The network architecture includes a PCI Express (PCIe) fabric configured to provide direct access to the network storage from compute nodes of each of the plurality of streaming arrays, the PCIe fabric including a plurality of array-level PCIe switches, each array-level PCIe switch communicatively coupled to compute nodes of compute sleds of a corresponding streaming array and communicatively coupled to the storage server. The network storage is shared by the plurality of streaming arrays.

20 Claims, 7 Drawing Sheets

Related U.S. Application Data (60) Provisional application No. 62/977,138, filed on Feb. 14, 2020.

(56) References Cited

U.S. PATENT DOCUMENTS

| | | | | |
|---|---|---|---|---|
| 7,237,036 B2* | 6/2007 | Boucher | | H04L 69/12 |
| | | | | 709/236 |
| 8,327,187 B1* | 12/2012 | Metcalf | | H04L 49/109 |
| | | | | 714/10 |
| 9,432,298 B1* | 8/2016 | Smith | | H04L 49/9057 |
| 10,409,524 B1* | 9/2019 | Branover | | G06F 3/0634 |
| 2004/0130552 A1* | 7/2004 | Duluk, Jr. | | G06T 15/005 |
| | | | | 345/506 |
| 2011/0187829 A1* | 8/2011 | Nakajima | | H04N 13/20 |
| | | | | 348/46 |
| 2012/0154375 A1* | 6/2012 | Zhang | | G06F 9/4411 |
| | | | | 345/522 |
| 2013/0054901 A1* | 2/2013 | Biswas | | G06F 13/1642 |
| | | | | 711/E12.001 |
| 2014/0344488 A1* | 11/2014 | Flynn | | G06F 5/14 |
| | | | | 710/52 |
| 2015/0091927 A1* | 4/2015 | Cote | | G06T 1/60 |
| | | | | 345/547 |
| 2015/0281126 A1* | 10/2015 | Regula | | H04L 67/55 |
| | | | | 709/212 |
| 2017/0102510 A1* | 4/2017 | Faw | | H05K 7/1492 |
| 2017/0105313 A1* | 4/2017 | Shedd | | H05K 7/20809 |
| 2018/0349231 A1* | 12/2018 | Panda | | G06F 11/0793 |
| 2018/0361237 A1* | 12/2018 | Perlman | | H04L 65/80 |
| 2019/0140838 A1* | 5/2019 | Bernat | | H04L 9/3247 |
| 2019/0196745 A1* | 6/2019 | Persson | | G06F 13/28 |
| 2019/0205153 A1* | 7/2019 | Niestemski | | G06F 9/5027 |
| 2020/0021492 A1* | 1/2020 | Ganguli | | G06F 3/061 |
| 2020/0364303 A1* | 11/2020 | Liu | | G10L 15/16 |
| 2021/0255979 A1* | 8/2021 | Colenbrander | | G06F 13/1668 |

* cited by examiner

RACK ASSEMBLY PROVIDING HIGH SPEED STORAGE ACCESS FOR COMPUTE NODES TO A STORAGE SERVER THROUGH A PCI EXPRESS FABRIC

CLAIM OF PRIORITY

The present application is a continuation of and claims priority to and the benefit of the commonly owned patent application, U.S. Ser. No. 16/945,635, filed on Jul. 31, 2020, entitled "NETWORK ARCHITECTURE PROVIDING HIGH SPEED STORAGE ACCESS THROUGH A PCI EXPRESS FABRIC BETWEEN A COMPUTE NODE AND A STORAGE SERVER"; which claims priority to and the benefit of the commonly owned, provisional patent application, U.S. Ser. No. 62/977,138, filed on Feb. 14, 2020, entitled "NETWORK ARCHITECTURE PROVIDING HIGH SPEED STORAGE ACCESS THROUGH A PCI EXPRESS FABRIC BETWEEN A COMPUTE NODE TO A STORAGE SERVER," the disclosures of which are herein incorporated by reference in their entireties for all purposes.

TECHNICAL FIELD

The present disclosure is related to network storage, and more specifically for high speed network storage access to compute nodes located on compute sleds of a streaming array of a rack assembly using PCI-Express.

BACKGROUND OF THE DISCLOSURE

In recent years there has been a continual push for online services that allow for online or cloud gaming in a streaming format between a cloud gaming server and a client connected through a network. The streaming format has increasingly become more popular because of the availability of game titles on demand, the ability to execute more complex games, the ability to network between players for multi-player gaming, sharing of assets between players, sharing of instant experiences between players and/or spectators, allowing friends to watch a friend play a video game, having a friend join the on-going game play of a friend, and the like.

Unfortunately, the demand is also pushing up against the limits of the capabilities of network connections. For example, previous generations of streaming network architectures provided network storage using gigabit Ethernet communication connections (e.g., 40 gigabit per second Ethernet connections). However, the new generations of streaming network architectures require better (e.g., faster) bandwidth performance (e.g., Gigabyte connections).

It is in this context that embodiments of the disclosure arise.

SUMMARY

Embodiments of the present disclosure relate to providing high speed access to network storage, such as within a rack assembly, capable of providing greater than 4 Gigabyte per second (GB/s) network storage bandwidth (e.g., access) per compute node.

Embodiments of the present disclosure disclose a network architecture. The network architecture includes network storage. The network architecture includes a plurality of streaming arrays, each streaming array including a plurality of compute sleds, wherein each compute sled includes one or more compute nodes. The network architecture includes a PCI Express (PCIe) fabric configured to provide direct access to the network storage from compute nodes of each of the plurality of streaming arrays. The PCIe fabric includes a plurality of array-level PCIe switches, wherein each array-level PCIe switch being communicatively coupled to compute nodes of compute sleds of a corresponding streaming array and communicatively coupled to the storage server. The network storage is shared by the plurality of streaming arrays.

Embodiments of the present disclosure disclose a network architecture. The network architecture includes network storage. The network architecture includes a plurality of streaming arrays, each streaming array including a plurality of compute sleds, wherein each compute sled includes one or more compute nodes. The network architecture includes a PCI Express (PCIe) fabric configured to provide direct access to the network storage from compute nodes of each of the plurality of streaming arrays. The PCIe fabric includes a plurality of array-level PCIe switches, wherein each array-level PCIe switch being communicatively coupled to compute nodes of compute sleds of a corresponding streaming array and communicatively coupled to the storage server. The network architecture includes an Ethernet fabric configured to communicatively couple compute nodes of compute sleds of the plurality of streaming arrays to the network storage for purposes of streaming compute sled and compute node management information. The network storage is shared by the plurality of streaming arrays.

Other aspects of the disclosure will become apparent from the following detailed description, taken in conjunction with the accompanying drawings, illustrating by way of example the principles of the disclosure.

BRIEF DESCRIPTION OF THE DRAWINGS

The disclosure may best be understood by reference to the following description taken in conjunction with the accompanying drawings in which.

DETAILED DESCRIPTION

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, embodiments of the present disclosure provide for high speed access to network storage, such as within a rack assembly, which is capable of providing greater than 4 Gigabyte per second (GB/s) network storage bandwidth (e.g., access) per compute node (e.g., of a rack assembly) at non-volatile memory express (NVMe) latencies.

With the above general understanding of the various embodiments, example details of the embodiments will now be described with reference to the various drawings.

Throughout the specification, the reference to "application" or "game" or "video game" or "gaming application" is meant to represent any type of interactive application that is directed through execution of input commands. For illustration purposes only, an interactive application includes applications for gaming, word processing, video processing, video game processing, etc. Further, the terms introduced above are interchangeable.

Figure 1:
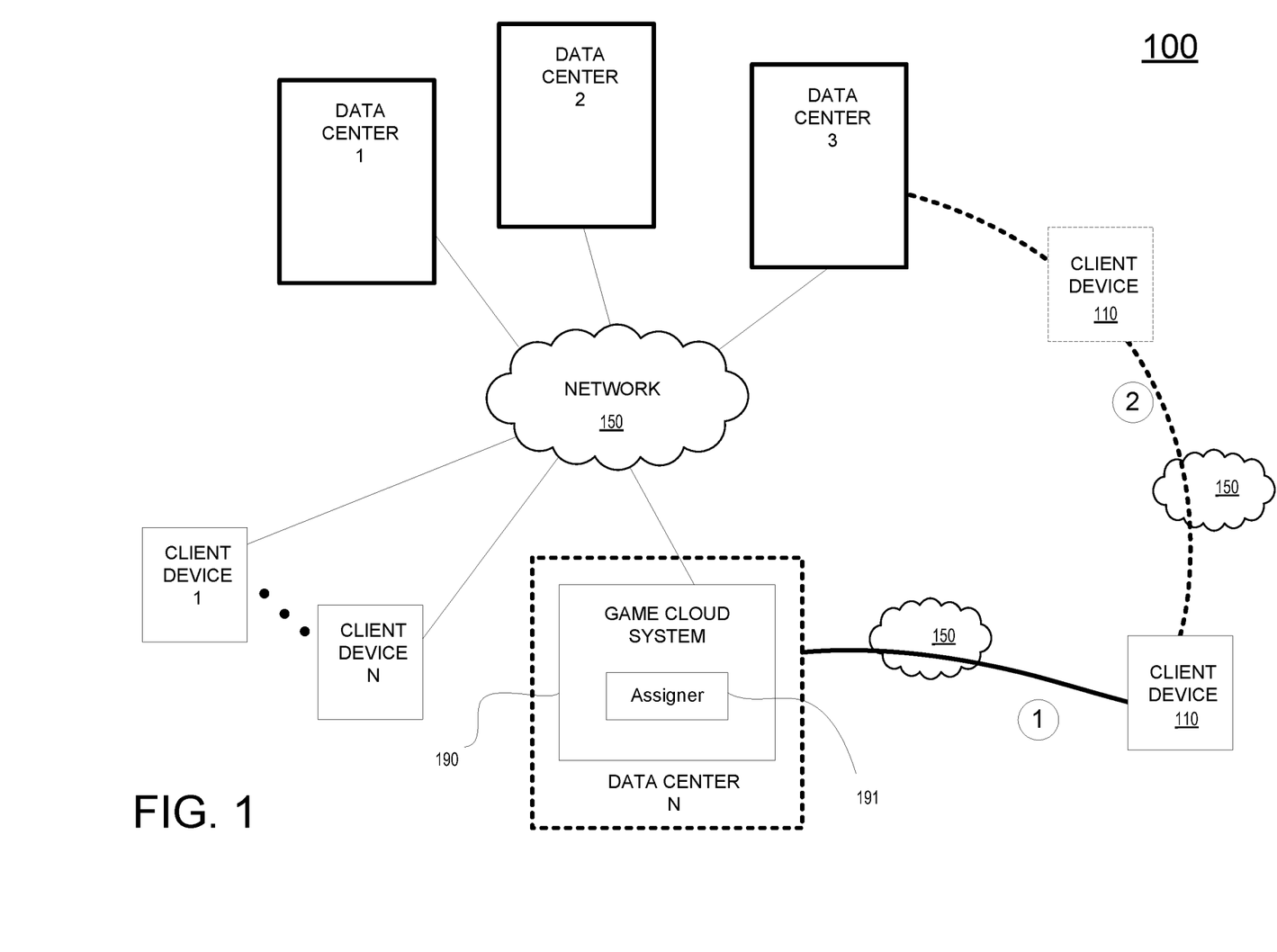
FIG. 1 is a diagram of a game cloud system for providing gaming over a network between one or more compute nodes located at one or more data centers, in accordance with one embodiment of the present disclosure.

FIG. 1 is a diagram of a system 100 for providing gaming over a network 150 between one or more compute nodes located at one or more data centers, in accordance with one embodiment of the present disclosure. The system is configured to provide gaming over a network between one or more cloud gaming servers, and more specifically is configured for high speed access to network storage, such as within a rack assembly, from compute nodes, in accordance with one embodiment of the present disclosure. Cloud gaming includes the execution of a video game at the server to generate game rendered video frames, which are then sent to a client for display.

It is also understood that cloud gaming may be performed using physical machines (e.g., central processing units—CPUs—and graphics processing units—GPU), or virtual machines, or a combination of both, in various embodiments (e.g. in a cloud gaming environment or within a stand-alone system). For example, virtual machines (e.g. instances) may be created using a hypervisor of a host hardware (e.g. located at a data center) utilizing one or more components of a hardware layer, such as multiple CPUs, memory modules, GPUs, network interfaces, communication components, etc. These physical resources may be arranged in racks, such as racks of CPUs, racks of GPUs, racks of memory, etc., wherein the physical resources in the racks may be accessed using top of rack switches facilitating a fabric for assembling and accessing of components used for an instance (e.g. when building the virtualized components of the instance). Generally, a hypervisor can present multiple guest operating systems of multiple instances that are configured with virtual resources. That is, each of the operating systems may be configured with a corresponding set of virtualized resources supported by one or more hardware resources (e.g. located at a corresponding data center). For instance, each operating system may be supported with a virtual CPU, multiple virtual GPUs, virtual memory, virtualized communication components, etc. In addition, a configuration of an instance that may be transferred from one data center to another data center to reduce latency. Instant utilization defined for the user or game can be utilized when saving a user's gaming session. The instant utilization can include any number of configurations described herein to optimize the fast rendering of video frames for a gaming session. In one embodiment, the instant utilization defined for the game or the user can be transferred between data centers as a configurable setting. The ability to transfer the instant utilization setting enables for efficient migration of game play from data center to data center in case the user connects to play games from different geo locations.

System 100 includes a game cloud system 190 as implemented through one or more data centers (e.g., data centers 1 through N). As shown an instance of game cloud system 190 could be located in data center N that provides management functionality, wherein the management functionality of the game cloud system 190 may be distributed through multiple instances of the game cloud system 190 at each of the data centers. In some implementations, the game cloud system management functionality may be located outside of any of the data centers.

That game cloud system 190 includes an assigner 191 that is configured to assign each of the client devices (e.g., 1-N) to corresponding resources in corresponding data centers. In particular, when client device 110 logs into the game cloud system 190, the client device 110 may be connected with an instance of a game cloud system 109 at data center N, wherein data center N may be geographically closest to client device 110. The assigner 191 is able to perform diagnostic testing to determine available transmit and receive bandwidth to the client device 110. Based on the testing, the assigner 191 is able to assign resources to client device 110 with great specificity. For example, the assigner 191 is able to assign a particular data center to the client device 110. In addition, the assigner 191 is able to assign to the client device 110 a particular compute node, of a particular compute sled, of a particular streaming array, of a particular rack assembly. Assignment may be performed based on knowledge of assets (e.g., games) that are available at the compute nodes. Previously, the client device is assigned general to a data center, without further assignment to rack assemblies. In this manner, the assigner 191 is able to assign a client device that is requesting execution of a particular gaming application that is compute intensive to a compute node that may not be running compute intensive applications. In addition, load management of assigning of compute intensive gaming applications as requested by clients may be performed at the assigner 191. For example, the same compute intensive gaming application that is being requested over a short period of time, may be spread across different compute nodes, of different compute sleds in one rack assembly or different rack assemblies to reduce load on a particular compute node, compute sled, and/or rack assembly.

In some embodiments, the assignment may be performed based on machine learning. In particular, resource demand may be predicted for a particular data center, and its corresponding resources. For example, if it can be predicted that a data center will soon be handling many clients running compute intensive gaming applications, then the assigner 191 may assign client device 110 with that knowledge, and assign resource that may not be currently utilizing all of its resource capabilities. In another case, assigner 191 may switch client device 110 from the game cloud system 190 in data center N to resources available in data center 3, in anticipation of increased loading at data center N. In addition, future clients may be assigned to resources in a distributed fashion, such that the load and demand for resources may be distributed throughout the game cloud system, across multiple data centers, across multiple rack assemblies, across multiple compute sleds, and/or across multiple compute nodes. For example, client device 110 may be assigned resources from both game cloud systems on data center N (e.g., over path 1) and data center 3 (e.g., over path 2).

Once the client device 110 is assigned to a particular compute node, of a corresponding compute sled, of a corresponding streaming array, the client device 110 connects to the corresponding data center through the network. That is, the client device 110 may be communicating with a different data center, such as data center 3, than the one performing assignment.

System 100 provides gaming via a game cloud system 190, wherein the game is being executed remote from client device (e.g. thin client) of a corresponding user that is playing the game, in accordance with one embodiment of the present disclosure. System 100 may provide gaming control to one or more users playing one or more games through the cloud game network or game cloud system 190 via network 150 in either single-player or multi-player modes. In some embodiments, the cloud game network or game cloud system 190 may include a plurality of virtual machines (VMs) running on a hypervisor of a host machine, with one or more virtual machines configured to execute a game processor module utilizing the hardware resources available to the hypervisor of the host. Network 150 may include one or more communication technologies. In some embodiments, network 150 may include $5^{th}$ Generation (5G) network technology having advanced wireless communication systems.

In some embodiments, communication may be facilitated using wireless technologies. Such technologies may include, for example, 5G wireless communication technologies. 5G is the fifth generation of cellular network technology. 5G networks are digital cellular networks, in which the service area covered by providers is divided into small geographical areas called cells. Analog signals representing sounds and images are digitized in the telephone, converted by an analog to digital converter and transmitted as a stream of bits. All the 5G wireless devices in a cell communicate by radio waves with a local antenna array and low power automated transceiver (transmitter and receiver) in the cell, over frequency channels assigned by the transceiver from a pool of frequencies that are reused in other cells. The local antennas are connected with the telephone network and the Internet by a high bandwidth optical fiber or wireless backhaul connection. As in other cell networks, a mobile device crossing from one cell to another is automatically transferred to the new cell. It should be understood that 5G networks are just an example type of communication network, and embodiments of the disclosure may utilize earlier generation wireless or wired communication, as well as later generation wired or wireless technologies that come after 5G.

As shown, the system 100 including game cloud system 190 can provide access to a plurality of video games. In particular, each of the client devices may be requesting access to different games from the cloud game network. For example, the game cloud system 190 may provide one or more game servers that may be configured as one or more virtual machines executing on one or more hosts to execute a corresponding gaming application. For example, a game server may manage a virtual machine supporting a game processor that instantiates an instance of a game for a user. As such, a plurality of game processors of one or more game servers associated with a plurality of virtual machines is configured to execute multiple instances of one or more games associated with gameplays of a plurality of users. In that manner, back-end server support provides streaming of media (e.g. video, audio, etc.) of gameplays of a plurality of gaming applications to a plurality of corresponding users. That is, a game server of the game cloud system 190 is configured to stream data (e.g. rendered images and/or frames of a corresponding gameplay) back to a corresponding client device through network 150. In that manner, a computationally complex gaming application may be executing at the back-end server in response to controller inputs received and forwarded by client device. Each server is able to render images and/or frames that are then encoded (e.g. compressed) and streamed to the corresponding client device for display.

In one embodiment, cloud game network or game cloud system 190 is a distributed game server system and/or architecture. In particular, a distributed game engine executing game logic is configured as a corresponding instance of a corresponding game. In general, the distributed game engine takes each of the functions of a game engine and distributes those functions for execution by a multitude of processing entities. Individual functions can be further distributed across one or more processing entities. The processing entities may be configured in different configurations, including physical hardware, and/or as virtual components or virtual machines, and/or as virtual containers, wherein a container is different from a virtual machine as it virtualizes an instance of the gaming application running on a virtualized operating system. The processing entities may utilize and/or rely on servers and their underlying hardware on one or more servers (compute nodes) of the cloud game network or game cloud system 190, wherein the servers may be located on one or more racks. The coordination, assignment, and management of the execution of those functions to the various processing entities are performed by a distribution synchronization layer. In that manner, execution of those functions is controlled by the distribution synchronization layer to enable generation of media (e.g. video frames, audio, etc.) for the gaming application in response to controller input by a player. The distribution synchronization layer is able to efficiently execute (e.g. through load balancing) those functions across the distributed processing entities, such that critical game engine components/functions are distributed and reassembled for more efficient processing.

Figure 2:
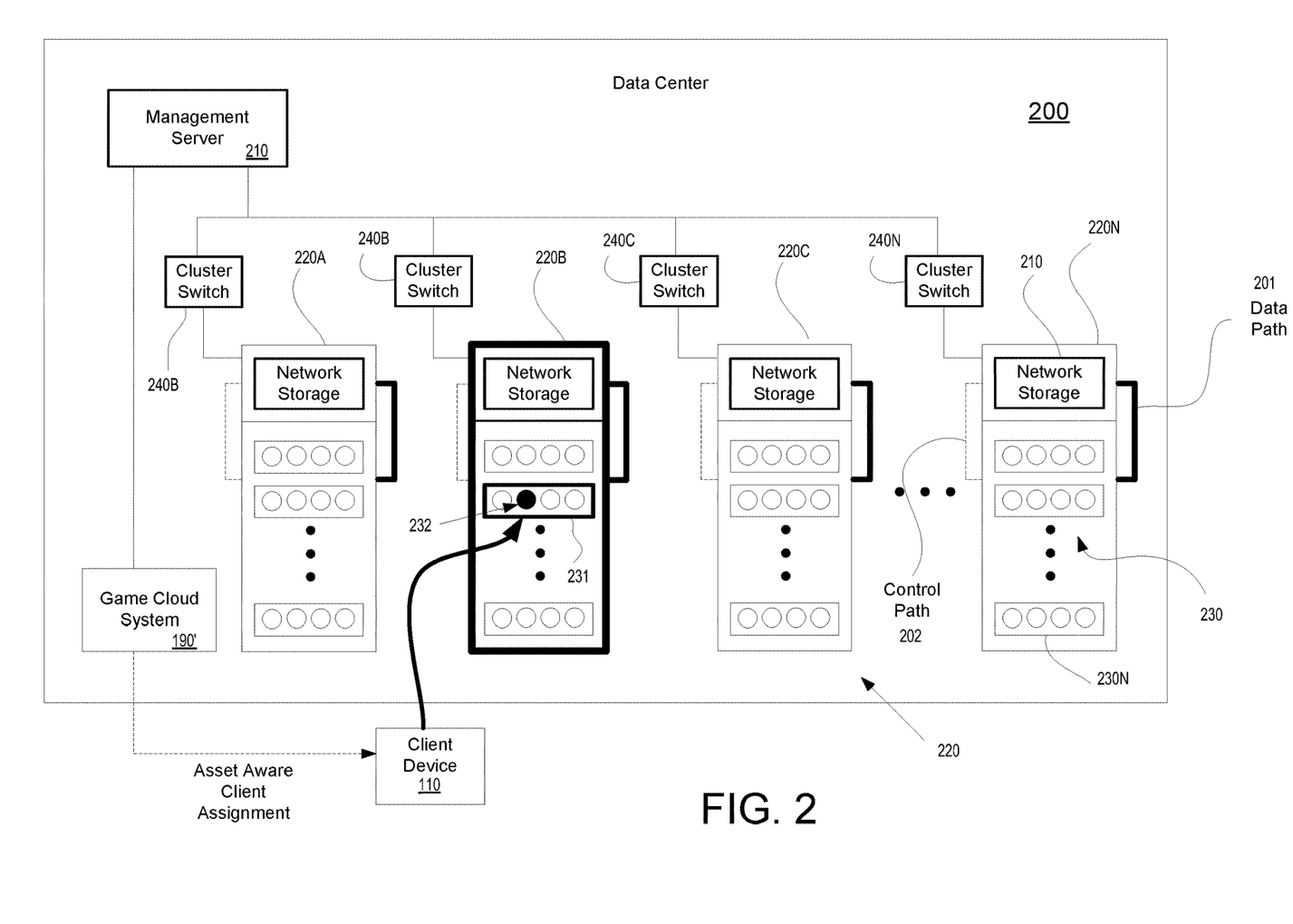
FIG. 2 is a diagram of a plurality of rack assemblies including a plurality of compute nodes at a representative data center of a game cloud system, in accordance with one embodiment of the present disclosure.

FIG. 2 is a diagram of a plurality of rack assemblies 210 including a plurality of compute nodes at a representative data center 200 of a game cloud system, in accordance with one embodiment of the present disclosure. For example, multiple data centers may be distributed throughout the world, such as in North America, Europe and Japan.

The data center 200 includes a plurality of rack assemblies 220 (e.g., rack assemblies 220A through 220N). Each of the rack assemblies includes corresponding network storage and a plurality of compute sleds. For example, representative rack assembly 220N includes network storage 210 and a plurality of compute sleds 230 (e.g., sleds 230A through 230N). Other rack assemblies may be similarly configured with or without modification. In particular, each of the compute sleds includes one or more compute nodes providing hardware resources (e.g., processors, CPUs, GPUs, etc.). For example, compute sled 230N in the plurality of compute sleds 230 of rack assembly 220N is shown to include four compute nodes, though it is understood that the rack assembly may include one or more compute nodes. Each rack assembly is coupled to a cluster switch that is configured to provide communication with a management server that is configured for management of the corresponding data center. For example, rack assembly 220N is coupled to cluster switch 240N. The cluster switch also provides communication to external communication networks (e.g., internet, etc.).

Each rack assembly provides high speed access to corresponding network storage, such as within a rack assembly. This high speed access is provided over a PCIe fabric which provides direct access between a compute node and the corresponding network storage. For example, in rack assembly 220N the high speed access is configured to provide a data path 201 between a particular compute node of a corresponding compute sled to a corresponding network storage (e.g., storage 210). In particular, the PCIe fabric is capable of providing greater than 4 Gigabyte per second (GB/s) network storage bandwidth (e.g., access) per compute node (e.g., of a rack assembly) at non-volatile memory express (NVMe) latencies. Also, a control path 202 is configured for communicating control and/or management information between the network storage 210 and each of the compute nodes.

As shown, the management server 210 of the data center 200 communicates with the assigner 191 (shown in FIG. 1) to assign resources to client device 110. In particular, management server 210 may work with an instance of the game cloud system 190' and in conjunction with the initial instance of the game cloud system 190 (e.g., of FIG. 1) to assign resources to client device 110. In embodiments, the assignment is performed based on asset awareness, such as knowing what resources and bandwidth are required and that exist at the data center. As such, embodiments of the present disclosure are configured to assign client device 110 to a particular compute node 232 of a corresponding compute sled 231 of a corresponding rack assembly 220B, for illustration.

The streaming rack assemblies are centered around compute nodes, which run gaming applications, video games and/or stream the audio/video of a game session to a one or more clients. Further, within each rack assembly, game content may be stored on a storage server providing network storage. The network storage is equipped with a large amount of storage and high-speed networking to serve many compute nodes by means of network file system (NFS) based network storage.

Figure 3:
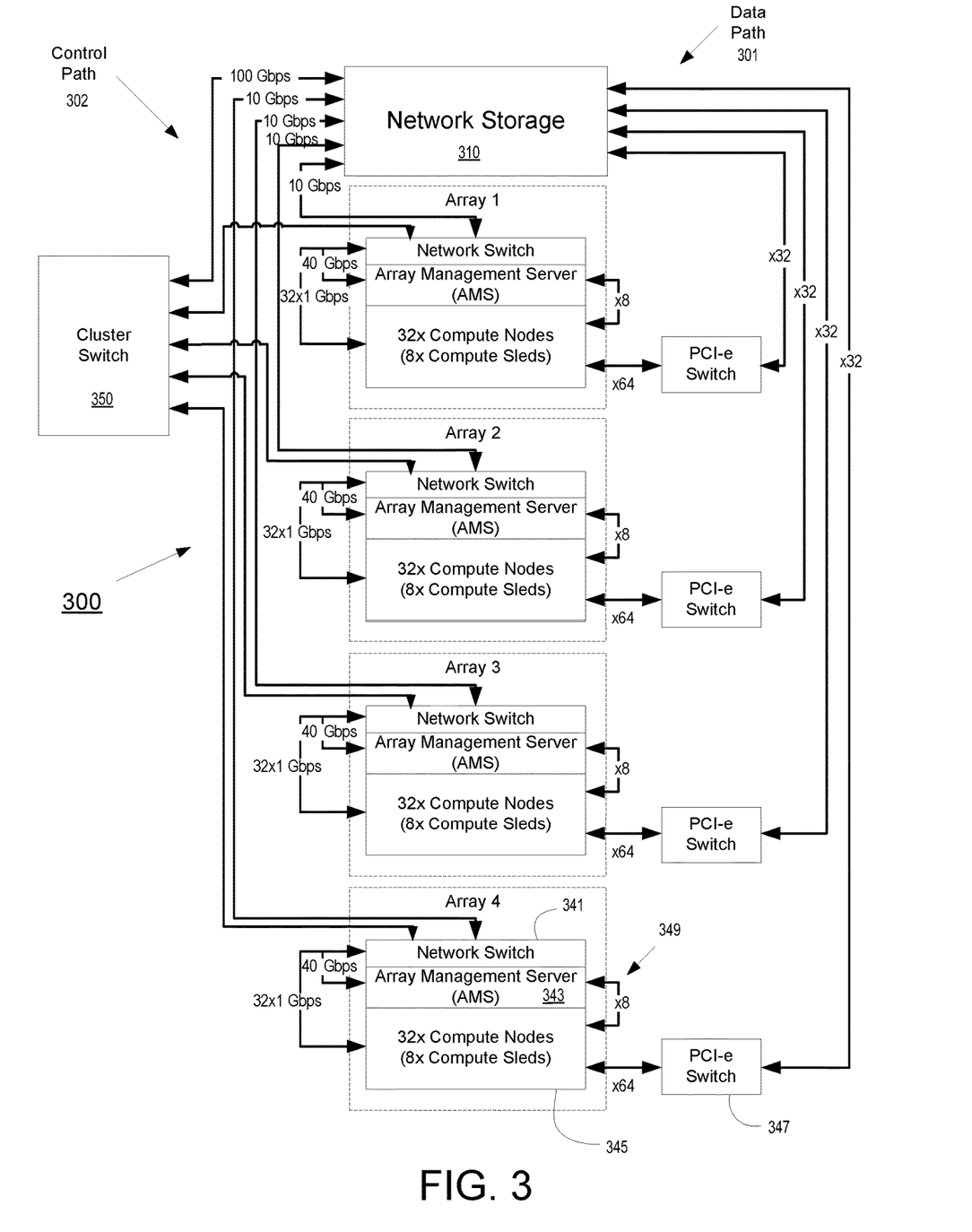
FIG. 3 is a diagram of a rack assembly configured for providing high speed access to network storage to compute nodes using PCIe communications, in accordance with one embodiment of the present disclosure.

FIG. 3 is a diagram of a rack assembly 300 configured for providing high speed access to network storage to compute nodes using PCIe communications, in accordance with one embodiment of the present disclosure. As shown, the diagram of FIG. 3 shows a high-level rack design for the rack assembly 300. Rack assembly 300 may be representative of one or more of the plurality of rack assemblies 220. For example, rack assembly may be representative of rack assembly 220N.

As previously described, traditional rack design provided access to network storage using Gigabit Ethernet. That is access to network storage provided 40 gb/s bandwidth access, which is not feasible for future gaming.

Embodiments of the present disclosure provides for access to network storage at greater than approximately 4 gigabytes per second (GB/s) bandwidth per compute node at NVMe level latencies. This is achieved through PCI Express switching technology and a rack-wide PCI Express fabric, in one embodiment.

Each rack assembly 300 includes a network storage 310. Game content is stored on the network storage 310 within each rack assembly. The network storage 310 is equipped with a large amount of storage and high-speed networking to serve many compute nodes by means of NFS based network storage.

In addition, each rack assembly 300 includes one or more streaming arrays. Though the rack assembly 300 is shown as having four arrays, it is understood that one or more streaming arrays may be included within the rack assembly 300. More particularly, each streaming array includes a network switch, an array management server (AMS), and one or more compute sleds. For example, representative streaming array 4 includes network switch 341, AMS 343, and one or more compute sleds 345. The other streaming arrays 1-3 may be similarly configured. The streaming arrays shown in FIG. 3 include eight compute sleds per streaming array for purposes of illustration, and it is understood that a streaming array can include any number of compute sleds, such that each compute sled includes one or more compute nodes.

In particular, each streaming array is serviced by a corresponding PCIe switch that is configured part of a PCIe fabric (e.g., Gen4) providing direct access between compute nodes and a storage server through the PCIe fabric. For example, representative streaming array 4 is serviced by PCIe switch 347. The PCIe fabric (i.e., including PCIe switches servicing each of the streaming arrays 1-4) provides a data path 301 (e.g., data path 201 in rack assembly 220N) that allows high speed access to game data stored in network storage 310, as previously described.

In addition, each streaming array is configured with an Ethernet fabric that provides a control path 302 (e.g., control path 202 in rack assembly 220N), such as for communicating control and/or management information to the streaming arrays.

Also, the rack assembly 300 is configured with shared power as managed by a rack management controller (not shown). In addition, the rack assembly may be configured with shared cooling (not shown).

The rack assembly 300 is designed around the requirement to provide high-speed storage access (e.g., at up to or greater than 4-5 GB/s) to each compute node. Storage is provided by a network storage 310, which stores game content in RAM and on NVMe drives (i.e., not a conventional just a bunch of disks—JBOD—storage server). In one embodiment, the game content is "read-only," and as such can thus be shared among systems. Individual compute nodes access the game content at the network storage 310 through a PCIe fabric (e.g., providing data path 301) between each of the streaming arrays and the network storage 310.

In particular, the PCIe fabric (e.g., Gen4) may assume that not all compute nodes need peak performance (4-5 GB/s) at the same time. Each sled has multiple lanes (e.g., 8) lanes of PCIe (e.g., up to 16 GB/s). For example, a total of 64 lanes (for 8 sleds) per streaming array is provided to the corresponding PCIe switch, which may be configured as having a multi lane (e.g., 96-lane) PCIe switch. However, each PCIe switch may only provide corresponding arrays 32 lanes to the network storage 310, depending on the design.

In addition, each rack assembly 300 includes a second PCIe fabric available between an array management server (AMS) and corresponding compute sleds. For example, array 4 includes a second PCIe fabric 349 providing communication between the AMS 343 and the one or more compute sleds 345. This fabric is lower performance (e.g., 1 lane of PCIe per sled), and may be used for lower-speed storage workloads and for sled management purposes.

In addition, each rack assembly 300 includes a conventional Ethernet network, such as to provide communications for the control path 302. For example, each compute node has 1×1 Gbps Ethernet (e.g., 32×1 Gbps for 32 compute nodes between the compute nodes and a corresponding network switch), which is used for "streaming audio/video" and management. The AMS and network storage have faster networking (e.g., 40 Gbps between a corresponding AMS and network switch, 10 Gbps between network storage 310 and a corresponding network switch, and 100 Gbps between network storage 310 and a cluster switch 350, for example) for network storage and management purposes.

Network storage 310 (e.g., server) may also be configured to provide network storage access to AMS servers and compute nodes. Network storage access to AMS servers is handled over conventional Ethernet networking (e.g., 10 Gbps between a corresponding network switch and the network storage 310). However, network storage to compute nodes is done over PCI Express by means of a custom protocol and custom storage solution (i.e., via data path 301). The background for this custom storage solution lies in the hardware and software design for the compute nodes, which utilizes PCIe switching.

Each compute node may use a "command buffer" based protocol to request data from a location, in one embodiment. The network storage 310 is expected to locate the data. In particular, the compute node will use a direct memory access (DMA) engine to move into its own memory during a "read operation". Data stored on the network storage 310 is stored in RAM and NVMe. Software on the network storage 310 will ensure data is cached in RAM where possible to avoid having to retrieve data from NVMe. Many compute nodes are expected to access the same content, so caching is feasible.

Figure 4:
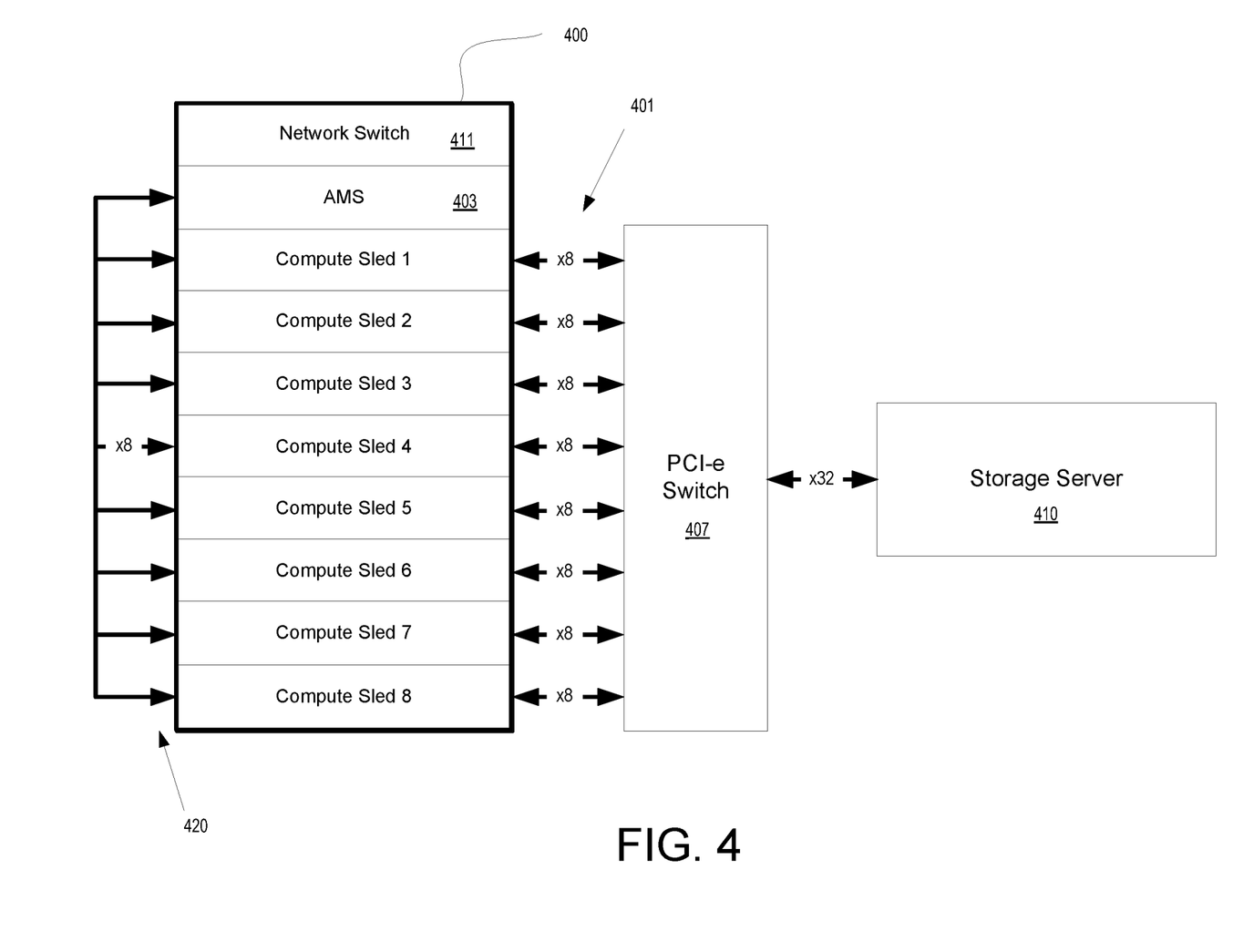
FIG. 4 is a diagram of a streaming array including a plurality of compute nodes located within a rack assembly configured for providing high speed access to network storage to compute nodes using PCIe communications, in accordance with one embodiment of the present disclosure.

FIG. 4 is a diagram of a streaming array 400 including a plurality of compute nodes located within a rack assembly configured for providing high speed access to network storage 410 to compute nodes using PCIe communications, in accordance with one embodiment of the present disclosure. A rack assembly configured for streaming content to one or more users is divided in "Streaming Arrays", such as streaming arrays 1-4 of FIG. 3 accessing network storage 310. In particular, arrays are a section of rack assembly (e.g., rack assembly 300 of FIG. 3) consisting of a network switch, an Array Management Server (AMS) and multiple compute sleds (e.g., one or more compute sleds per array, each compute sled holding one or more compute nodes), as previously described. Multiple arrays 400 are configured within a rack assembly to share a network storage, but otherwise act independently.

As shown, Array Management Server (AMS) 403 is a server within a corresponding streaming array 400, which is responsible for managing all operations within the streaming array. Roughly it is handling two classes of operations. First, the AMS 403 manages "configuration work", which is about ensuring each compute sled (e.g., sleds 1-8) is in working order. This involves powering sleds, ensuring software is up to date, configuration of networking, configuration of PCIe switch, etc.

A second class of operation for the AMS 403 is management of Cloud Gaming sessions. This involves setting up a Cloud Gaming session on a corresponding compute node, providing network/internet access to one or more compute nodes, providing storage access and monitoring of a cloud gaming session.

As such, the AMS 403 is configured to manage compute nodes and compute sleds, wherein each compute sled includes one or more compute nodes. For example, the AMS 403 enables power delivery to compute nodes using general purpose input/output (GPIO) to a power interposer. The AMS 403 is configured to control and monitor compute nodes using universal asynchronous receive transmit (UART) signals delivering serial data (e.g., power on/off, diagnostics, and logging information), in one embodiment. The AMS 403 is configured to perform firmware updates on compute nodes. The AMS 403 is configured to perform configuration of compute sleds and the corresponding PCIe switch 407.

That streaming array 400 is configured to provide storage across PCI Express to compute nodes, as previously described. For example, a PCIe fabric provides data path 402 between compute nodes on compute sleds and the PCIe switch 407). Read-write storage access per compute node is provided at up to 500 megabytes per second (MB/s), in embodiments. In addition, there is 1-2 Gigabytes (GB) per storage per compute node, in one implementation, though other sizes of storage are supported.

In addition, each streaming array 400 provides network/internet access to compute nodes, as previously described. For example, network access (e.g., through network switch 411 and over a path—not shown, such as Ethernet) is provided at 100 megabits per second (mb/s) per compute node.

As shown in FIG. 4, the main functionality of the AMS 403 is the PCI Express fabric connection to each of the compute sleds. For example, PCIe fabric 420 is shown providing communication between compute nodes on compute sleds and the AMS 403. In one embodiment, the PCI Express fabric connection is implemented using "passive PCI Express adapters," as each compute sled may be configured with a PCI Express Gen4 switch, and distance between AMS and compute sleds should be short.

The AMS 403 may be configured with a central processing unit (CPU) with random access memory (RAM). There may be an input/output (I/O) for PCIe fabric. There is a network connection for Ethernet).

The AMS 403 may be configured with storage (e.g., 2×2 terabyte NVMe). In addition, there may be a PCIe fabric connection to each compute sled, such as using a passive PCIe fabric adapter. Also, there is a bus bar providing power (e.g., 12 volts).

Figure 5:
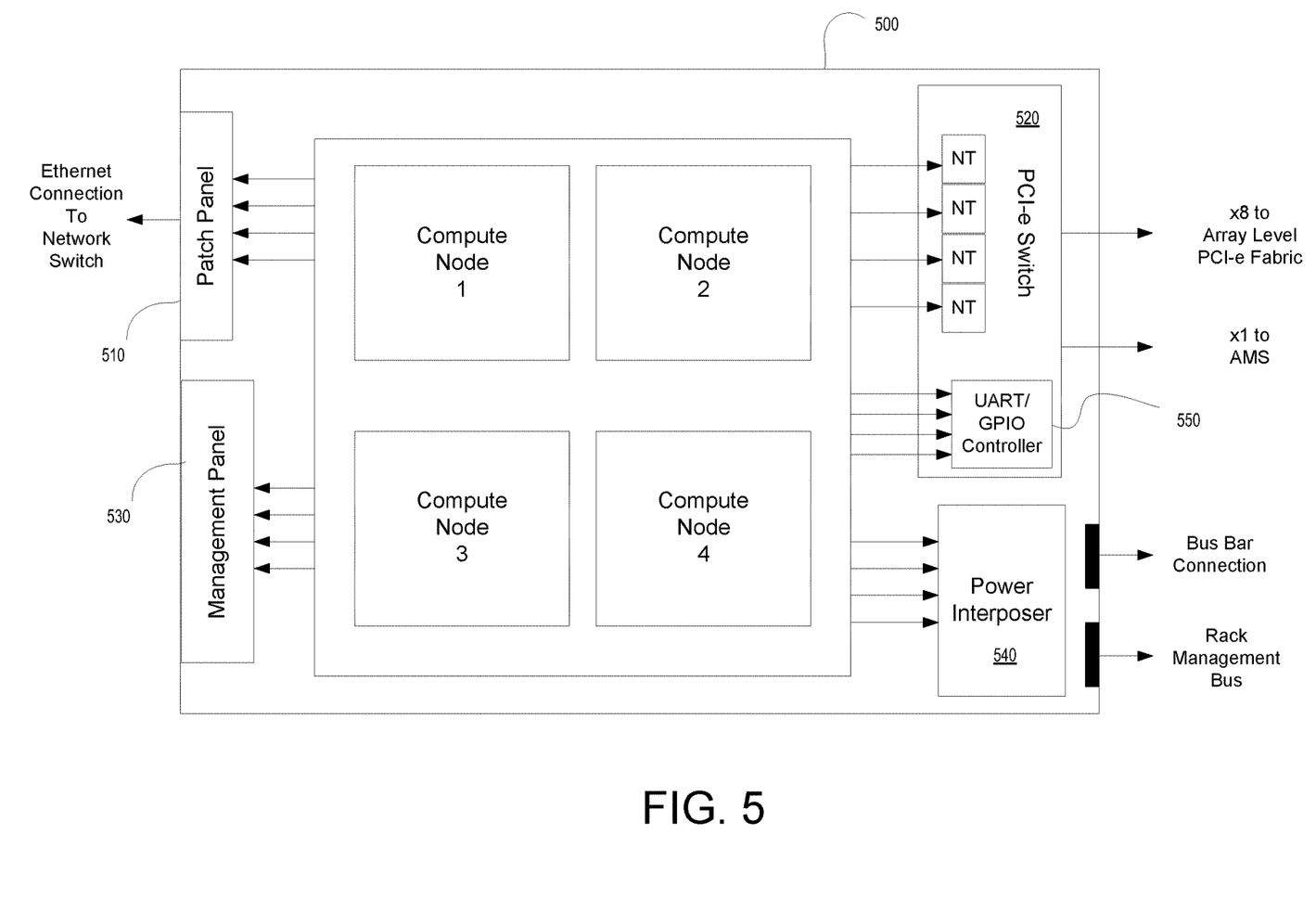
FIG. 5 is a diagram of a compute sled including a plurality of compute nodes located within a rack assembly configured for providing high speed access to network storage to compute nodes using PCIe communications, in accordance with one embodiment of the present disclosure.

FIG. 5 is a diagram of a compute sled 500 including a plurality of compute nodes (e.g., nodes 1-4) located within a rack assembly configured for providing high speed access to network storage to compute nodes using PCIe (e.g., Gen 4-4$^{th}$ generation) communications, in accordance with one embodiment of the present disclosure. FIG. 5 shows a plurality of compute nodes (e.g., nodes 1-4) and auxiliary hardware to support operation of the compute nodes.

Each compute sled 500 includes one or more compute nodes. Although FIG. 5 shows a compute sled including four compute nodes (e.g., nodes 1-4), it is understood that any number of compute nodes may be provided in a compute sled, including one or more compute nodes. The compute sled 500 may provide a hardware platform (e.g., circuit board) providing compute resources (e.g., through compute nodes).

The compute sled 500 includes an Ethernet patch panel 510, which is configured to connect Ethernet cables between compute nodes (e.g., nodes 1-4) and a rack level network switch (not shown), as previously described.

The compute sled 500 includes PCIe switch board 520.

The compute sled 500 includes a management panel 530. For example, the management panel 530 may give status, such as LEDs and buttons.

The compute sled 500 includes a power interposer board 540, which is configured to provide power to the compute sled.

Each compute sled includes one or more compute nodes (e.g., nodes 1-4). Each compute node located within a rack assembly is configured for providing high speed access to network storage (not shown) to compute nodes using PCIe communications (e.g., Gen 4), in accordance with one embodiment of the present disclosure. A compute node includes several I/O interfaces. For example, the compute node may include an M.2 port, and multiple lanes for PCIe Gen4 (bi-directional).

The PCIe (e.g., Gen4) interface (e.g., 4 lanes) can be used to expand the system with additional devices. In particular, the PCIe interface is used to connect to a PCIe fabric including a PCI Express switch 520 for high-speed storage. In addition, the compute node includes Ethernet connections (e.g., gigabit Ethernet). Also, the compute node includes one or more universal asynchronous receiver transmitter (UART) connections that are configured for transmitting and/or receiving serial data. For example, there may be one or more UART ports, which are meant for management purposes (e.g., connecting compute nodes with the UART/GPIO controller 550). A port may be used for remote control operations such as "power on", "power off" and diagnostics. Another UART port provides serial console capabilities.

Each compute node also includes a power input connector (e.g., 12 volts for designed power consumption) connected to power interposer 540.

Figure 6:
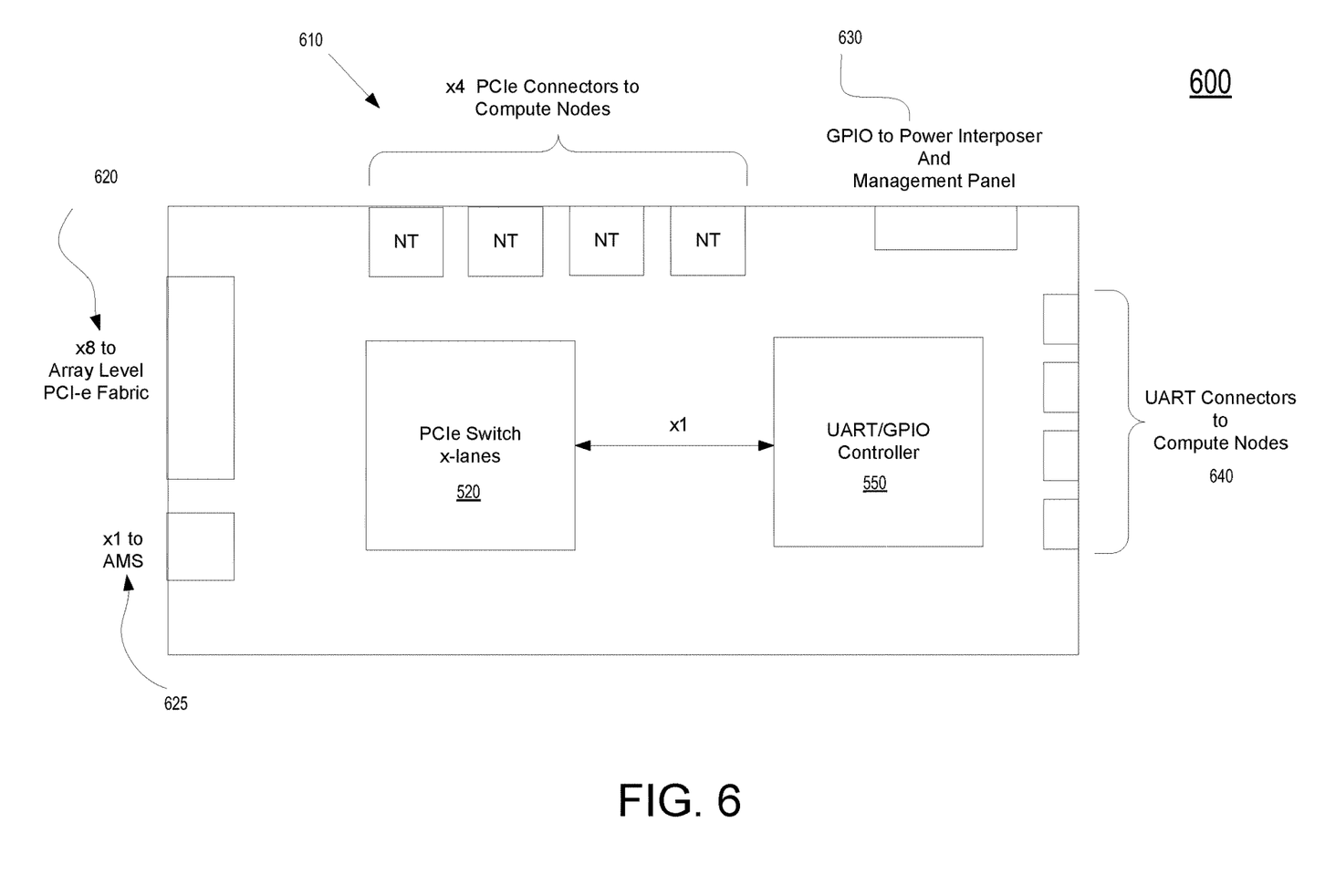
FIG. 6 is a diagram of a sled-level PCIe switch located within a rack assembly configured for providing high speed access to network storage to compute nodes using PCIe communications, in accordance with one embodiment of the present disclosure.

FIG. 6 is a diagram of a sled-level PCIe switch 600 located within a rack assembly configured for providing high speed access to network storage to compute nodes using PCIe communications, in accordance with one embodiment of the present disclosure.

The sled PCIe switch 600 may be configured as a circuit board within a corresponding compute sled, which has two roles. First, the sled-level PCIe switch 600 has a "fabric role" in which it connects individual compute nodes (e.g., 4 compute nodes) to AMS and to a corresponding network storage across a PCIe (e.g., Gen4) bus 620 by means of "non-transparent bridging" (NTB), in one embodiment. Second, the sled-level PCIe switch 600 has a "management role" in which UARTs and GPIO signals are provided for sled management.

In particular, PCIe (e.g., Gen4) connectivity is provided by external cable connectors, internal cable connectors and a PCIe edge connector. For example, an 8-lane PCIe (e.g., Gen4) external cable connection 620 may be used connect the compute sled to the network storage for storage workloads. A second external PCIe (e.g., Gen4) connection 625 to a second PCIe fabric connects to the AMS. For example, the second PCIe connection may include one lane, as it is used primarily for management functions, with auxiliary storage functionality.

In addition, internal PCIe (e.g., Gen4) cable connectors 610 may be used to connect the sled PCIe switch 520 using a cable to each of the compute nodes via their corresponding M.2 interfaces. Other connecting means may be implemented. For example, instead of using M.2 connection interfaces, other connectors and/or connector interfaces may be used, such as OCuLink, Slimline SAS, etc.

The management interface in the form of a UART and GPIO controller 550 is used by the AMS (not shown) to communicate with individual compute nodes as well as to manage power. The AMS uses multiple (e.g., two) UART interfaces per compute node for management purposes (e.g. power on/off, diagnostics, logging, etc.). The GPIO functionality is used to manage power delivery to each of the compute nodes through the power interposer board through connection 630. It also connects to a management panel (e.g., for LEDs and buttons) through connection 630, as previously described.

The sled-level PCIe switch 600 may include a PCIe (e.g., Gen4) switch 520. Also, multiple (e.g., four) Non-transparent (NT) bridging interfaces may be included. Further, multiple (e.g., four) DMA (direct memory access) engines may be included.

In addition, a UART/GPIO controller 550 is configured and includes a PCIe interface to PCIe switch, multiple (e.g., 8×) UART channels 640, and multiple (8×) GPIO connections the power interposer and management panel.

In addition, there are connectors to the PCIe fabric for network storage access. For example, in one implementation, an 8-lane external PCIe connector 620 to PCIe fabric to network storage is provided.

As previously described, a one lane external PCIe connector 625 to a second PCIe fabric providing access to AMS is also provided within the sled-level PCIe switch board 600. One or more PCIe edge connectors may also be provided.

Further, four multi lane (e.g., 4 lanes) internal PCIe connections 610 to compute nodes may be provided. For example, each compute node has 4 lanes.

There may be included a GPIO connector 630 to the power interposer. For example, 4 signals are required, one per compute node.

There may be four dual/pairs of UART connectors to a management panel. For example, each compute node has 2 UART interfaces, in one implementation. In other implementations, each compute node may have less than 2 UART interfaces, or more than 2 UART interfaces.

A power interposer providing power to a sled through connection 630 may be included. The compute sled may include a plurality of compute nodes located within a rack assembly configured for providing high speed access to network storage to compute nodes using PCIe communications, in accordance with one embodiment of the present disclosure. The power interposer delivers power from the rack's 12V bus bar to the compute sled, in one embodiment. In other embodiments, some other voltage is used for powering rack components, such as 48 volts, etc. For example, higher voltages (e.g., 48 volts) may be used for power efficiency purposes. For components that require a specific voltage (e.g., 12 volts), a power interposer may be used to convert power. For example, the power interposer may contain conversion logic (e.g., DC to DC converters) to convert 48 volts (or some other voltage) down to 12 volts. This is used to power the compute nodes as well as any auxiliary hardware. Power delivery to the compute nodes is controllable by GPIO by the sled PCIe switch. For each compute node there may be a dedicated signal to enable/disable power.

Also, a Rack Management Control interface is provided to the Rack Management Controller (RMC) to monitor the Power Interposer board. This provides diagnostic information such as voltages, currents and temperature. Rack management control interface may include voltage and/or current information, and temperature.

Power status information is delivered using GPIO signals to the Management Panel. This includes power status of each compute node as well as 12V status of the power interposer. In addition, a bus (e.g., 12 volt) bar interface is provided.

There may be hot-plug support, for example to add and/or remove compute sleds when power bus is powered on. For example, power may be delivered at 12 volts, or at other levels. Voltage to auxiliary components may be lower (e.g., below 6 volts), which can be generated out of the 12 volts on power bus.

The Management Panel may include a board/panel located in the front of a compute sled and shows sled status through LEDs. For each compute node there may be two LEDs providing control status information. The first is powered by the sled PCIe Switch using a software controllable GPIO signal. The second LED is from the power interposer board and shows power status (e.g., voltage level). A global power status from the Power Interposer board shows the overall power status of the sled.

Figure 7:
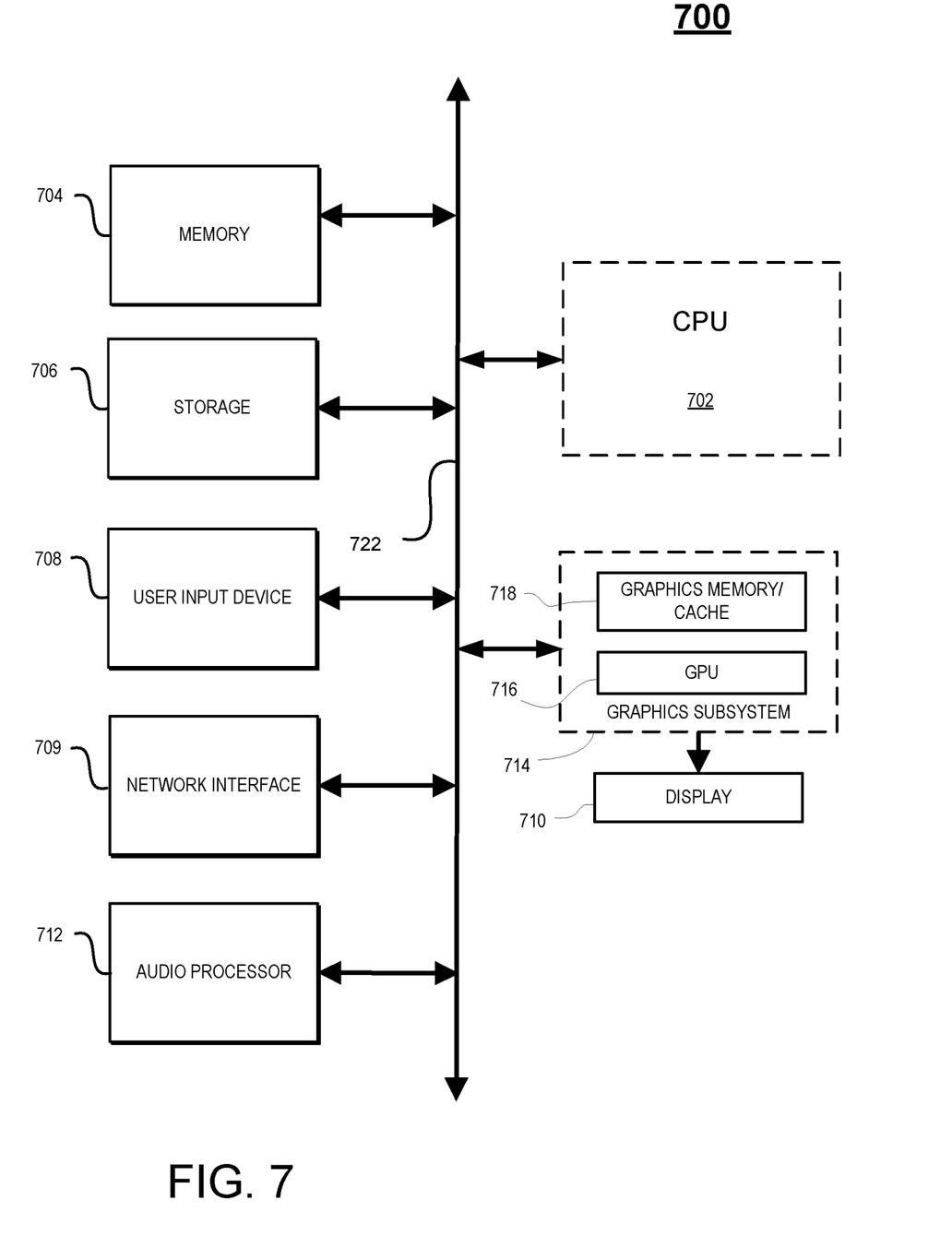
FIG. 7 illustrates components of an example device that can be used to perform aspects of the various embodiments of the present disclosure.

FIG. 7 illustrates components of an example device 700 that can be used to perform aspects of the various embodiments of the present disclosure. For example, FIG. 7 illustrates an exemplary hardware system suitable for providing high speed access to network storage to compute nodes of corresponding compute sleds configured within corresponding streaming arrays, such as within a rack assembly, in accordance with embodiments of the present disclosure. This block diagram illustrates a device 700 that can incorporate or can be a personal computer, a server computer, gaming console, mobile device, or other digital device, each of which is suitable for practicing an embodiment of the invention. Device 700 includes a central processing unit (CPU) 702 for running software applications and optionally an operating system. CPU 702 may be comprised of one or more homogeneous or heterogeneous processing cores.

In accordance with various embodiments, CPU 702 is one or more general-purpose microprocessors having one or more processing cores. Further embodiments can be implemented using one or more CPUs with microprocessor architectures specifically adapted for highly parallel and computationally intensive applications, such as media and interactive entertainment applications, of applications configured for graphics processing during execution of a game.

Memory 704 stores applications and data for use by the CPU 702 and GPU 716. Storage 706 provides non-volatile storage and other computer readable media for applications and data and may include fixed disk drives, removable disk drives, flash memory devices, and CD-ROM, DVD-ROM, Blu-ray, HD-DVD, or other optical storage devices, as well as signal transmission and storage media. User input devices 708 communicate user inputs from one or more users to device 700, examples of which may include keyboards, mice, joysticks, touch pads, touch screens, still or video recorders/cameras, and/or microphones. Network interface 709 allows device 700 to communicate with other computer systems via an electronic communications network, and may include wired or wireless communication over local area networks and wide area networks such as the internet. An audio processor 712 is adapted to generate analog or digital audio output from instructions and/or data provided by the CPU 702, memory 704, and/or storage 706. The components of device 700, including CPU 702, graphics subsystem including GPU 716, memory 704, data storage 706, user input devices 708, network interface 709, and audio processor 712 are connected via one or more data buses 722.

A graphics subsystem 714 is further connected with data bus 722 and the components of the device 700. The graphics subsystem 714 includes at least one graphics processing unit (GPU) 716 and graphics memory 718. Graphics memory 718 includes a display memory (e.g. a frame buffer) used for storing pixel data for each pixel of an output image. Graphics memory 718 can be integrated in the same device as GPU 716, connected as a separate device with GPU 716, and/or implemented within memory 704. Pixel data can be provided to graphics memory 718 directly from the CPU 702. Alternatively, CPU 702 provides the GPU 716 with data and/or instructions defining the desired output images, from which the GPU 716 generates the pixel data of one or more output images. The data and/or instructions defining the desired output images can be stored in memory 704 and/or graphics memory 718. In an embodiment, the GPU 716 includes 3D rendering capabilities for generating pixel data for output images from instructions and data defining the geometry, lighting, shading, texturing, motion, and/or camera parameters for a scene. The GPU 716 can further include one or more programmable execution units capable of executing shader programs.

The graphics subsystem 714 periodically outputs pixel data for an image from graphics memory 718 to be displayed on display device 710, or to be projected by a projection system (not shown). Display device 710 can be any device capable of displaying visual information in response to a signal from the device 700, including CRT, LCD, plasma, and OLED displays. Device 700 can provide the display device 710 with an analog or digital signal, for example.

In other embodiments, the graphics subsystem 714 includes multiple GPU devices, which are combined to perform graphics processing for a single application that is executing on a corresponding CPU. For example, the multiple GPUs can perform multi-GPU rendering of geometry for an application by pretesting the geometry against screen regions, which may be interleaved, before rendering objects for an image frame. In other examples, the multiple GPUs can perform alternate forms of frame rendering, wherein GPU 1 renders a first frame, and GPU 2 renders a second frame, in sequential frame periods, and so on until reaching the last GPU whereupon the initial GPU renders the next video frame (e.g. if there are only two GPUs, then GPU 1 renders the third frame). That is the GPUs rotate when rendering frames. The rendering operations can overlap, wherein GPU 2 may begin rendering the second frame before GPU 1 finishes rendering the first frame. In another implementation, the multiple GPU devices can be assigned different shader operations in the rendering and/or graphics pipeline. A master GPU is performing main rendering and compositing. For example, in a group including three GPUs, master GPU 1 could perform the main rendering (e.g. a first shader operation) and compositing of outputs from slave GPU 2 and slave GPU 3, wherein slave GPU 2 could perform a second shader (e.g. fluid effects, such as a river) operation, the slave GPU 3 could perform a third shader (e.g. particle smoke) operation, wherein master GPU 1 composites the results from each of GPU 1, GPU 2, and GPU 3. In that manner, different GPUs can be assigned to perform different shader operations (e.g. flag waving, wind, smoke generation, fire, etc.) to render a video frame. In still another embodiment, each of the three GPUs could be assigned to different objects and/or parts of a scene corresponding to a video frame. In the above embodiments and implementations, these operations could be performed in the same frame period (simultaneously in parallel), or in different frame periods (sequentially in parallel).

Accordingly, the present disclosure describes methods and systems configured for providing high speed access to network storage to compute nodes of corresponding compute sleds configured within corresponding streaming arrays, such as within a rack assembly.

It should be understood that the various embodiments defined herein may be combined or assembled into specific implementations using the various features disclosed herein. Thus, the examples provided are just some possible examples, without limitation to the various implementations that are possible by combining the various elements to define many more implementations. In some examples, some implementations may include fewer elements, without departing from the spirit of the disclosed or equivalent implementations.

Embodiments of the present disclosure may be practiced with various computer system configurations including hand-held devices, microprocessor systems, microprocessor-based or programmable consumer electronics, minicomputers, mainframe computers and the like. Embodiments of the present disclosure can also be practiced in distributed computing environments where tasks are performed by remote processing devices that are linked through a wire-based or wireless network.

With the above embodiments in mind, it should be understood that embodiments of the present disclosure can employ various computer-implemented operations involving data stored in computer systems. These operations are those requiring physical manipulation of physical quantities. Any of the operations described herein that form part of embodiments of the present disclosure are useful machine operations. Embodiments of the disclosure also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The disclosure can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing disclosure has been described in some detail for purposes of clarity of understanding, it will be apparent that certain changes and modifications can be practiced within the scope of the appended claims. Accordingly, the present embodiments are to be considered as illustrative and not restrictive, and embodiments of the present disclosure is not to be limited to the details given herein, but may be modified within the scope and equivalents of the appended claims.

What is claimed is:

1. A rack assembly, comprising:
    a storage server;
    a plurality of compute sleds configured as one or more streaming arrays, wherein each compute sled in the plurality of compute sleds includes one or more compute nodes;
    a PCI Express (PCIe) fabric providing direct access to the storage server from each compute node in the plurality of compute sleds; and
    one or more array-level PCIe switches in the PCIe fabric, wherein each array-level PCIe switch is communicatively coupled to each of one or more compute nodes of a corresponding streaming array and to the storage server,
    wherein the storage server is shared by the one or more streaming arrays.

2. The rack assembly of claim 1,
    wherein the corresponding streaming array includes one or more compute sleds.

3. The rack assembly of claim 2, wherein the corresponding streaming array includes:
    a network switch;
    an array management server configured for managing the one or more compute sleds; and
    an Ethernet fabric,
    wherein the network switch provides for access over the Ethernet fabric to a remote network via a cluster switch.

4. The rack assembly of claim 3,
    wherein the network switch provides for a control path over the Ethernet fabric for streaming management information to the one or more compute sleds and compute nodes in the one or more streaming arrays.

5. The rack assembly of claim 3, further comprising:
    another PCIe fabric coupling the array management server to the one or more compute sleds of the corresponding streaming array.

6. The rack assembly of claim 3,
    wherein the network switch provides for access to the storage server from the array management server over the Ethernet fabric.

7. The rack assembly of claim 3, wherein the array management server is configured to manage a cloud gaming session involving two or more instances of a video game executing on compute nodes of the one or more streaming arrays.

8. The rack assembly of claim 1,
    wherein at least one compute node in the plurality of compute sleds is configured for executing one or more instances of a plurality of video games.

9. The rack assembly of claim 1, wherein the storage server stores read-only game content shared by compute nodes in the one or more streaming arrays.

10. The rack assembly of claim 1,
    wherein each of the one or more compute nodes of the corresponding streaming array is communicatively coupled to the each array-level PCIe switch over a dedicated lane,
    wherein the each array-level PCI switch is coupled to the storage server over a set of lanes that includes less lanes than a total number of the one or more compute nodes of the corresponding streaming array.

11. A network architecture, comprising:
a plurality of rack assemblies, wherein each rack assembly in the plurality of rack assemblies includes:
  a storage server;
  a plurality of compute sleds configured as one or more streaming arrays, wherein each compute sled in the plurality of compute sleds includes one or more compute nodes, wherein a corresponding streaming array in the each rack assembly includes one or more compute sleds;
  a PCI Express (PCIe) fabric providing direct access to the storage server from each compute node in the plurality of compute sleds; and
  one or more array-level PCIe switches in the PCIe fabric, wherein each array-level PCIe switch is communicatively coupled to each of one or more compute nodes of a corresponding streaming array and to the storage server,
  wherein the storage server in the each rack assembly is shared by the one or more streaming arrays in the each rack assembly;
a plurality of cluster switches coupled to the plurality of rack assemblies; and
a management server coupled to the plurality of cluster switches, wherein the management server is configured for management of the plurality of rack assemblies.

12. The network architecture of claim 11,
wherein the management server is configured for assigning one or more computing resources in the plurality of rack assemblies to a client device.

13. The network architecture of claim 11, wherein the corresponding streaming array in the each rack assembly includes:
  a network switch;
  an array management server configured for managing the one or more compute sleds; and
  an Ethernet fabric,
  wherein the network switch provides for access over the Ethernet fabric to a remote network via a cluster switch.

14. The network architecture of claim 13,
wherein the network switch in the each rack assembly provides for a control path over the Ethernet fabric for streaming management information to the one or more compute sleds and compute nodes in the one or more streaming arrays.

15. The network architecture of claim 13,
another PCIe fabric coupling the array management server to the one or more compute sleds of the corresponding streaming array.

16. The network architecture of claim 13,
wherein the network switch in the each rack assembly provides for access to the storage server from the array management server over the Ethernet fabric.

17. The network architecture of claim 13,
wherein the array management server in the each rack assembly is configured to manage a cloud gaming session involving two or more instances of a video game executing on compute nodes of the one or more streaming arrays.

18. The network architecture of claim 11,
wherein at least one compute node in the plurality of compute sleds in the each rack assembly is configured for executing one or more instances of a plurality of video games.

19. The network architecture of claim 11, wherein the storage server in the each rack assembly stores read-only game content shared by compute nodes in the one or more streaming arrays.

20. The network architecture of claim 11,
wherein each of the one or more compute nodes of the corresponding streaming array in the each rack assembly is communicatively coupled to the each array-level PCIe switch over a dedicated lane,
wherein the each array-level PCI switch in the each rack assembly is coupled to the storage server over a set of lanes that includes less lanes than a total number of the one or more compute nodes of the corresponding streaming array.

* * * * *